(12) United States Patent
Tran et al.

(10) Patent No.: US 6,172,414 B1
(45) Date of Patent: Jan. 9, 2001

(54) APPARATUS AND METHOD FOR SNAP-ON THERMO-COMPRESSION BONDING

(75) Inventors: Dean Tran, Westminster; Eric R. Anderson, Redondo Beach; Ronald L. Strijek, Vista; Edward A. Rezek, Torrance, all of CA (US)

(73) Assignee: TRW Inc., Redondo Beach, CA (US)

( * ) Notice: Under 35 U.S.C. 154(b), the term of this patent shall be extended for 0 days.

(21) Appl. No.: 09/067,222

(22) Filed: Apr. 28, 1998

(51) Int. Cl.⁷ .............................. H01L 23/04; H01L 23/10; H01L 23/12
(52) U.S. Cl. ........................... 257/678; 257/710; 257/711; 257/698; 257/699
(58) Field of Search ........................... 257/678, 692, 257/684, 698, 699, 729, 710, 711; 438/108; 148/589, 590, 595; 29/410, 437; 228/180.22

(56) References Cited

U.S. PATENT DOCUMENTS

| | | | |
|---|---|---|---|
| 5,118,584 | 6/1992 | Evans et al. | 430/313 |
| 5,214,308 | * 5/1993 | Nishiguchi et al. | 257/738 |
| 5,457,879 | * 10/1995 | Gurtler et al. | 29/895 |
| 5,525,065 | 6/1996 | Sobhani | 29/831 |
| 5,558,271 | 9/1996 | Rostoker et al. | 228/180.22 |
| 5,643,831 | * 7/1997 | Ochiai et al. | 438/108 |

* cited by examiner

Primary Examiner—Mahshid Saadat
Assistant Examiner—Jhihan B. Clark
(74) Attorney, Agent, or Firm—Michael S. Yatsko

(57) ABSTRACT

An interconnected apparatus for producing a low loss, reproducible electrical interconnection between a semiconductor device and a substrate includes a rod and rod receptor. The rod, generally cylindrically shaped, is attached to the semiconductor device and includes an outer circumferential wall which comes into contact with the rod receptor during a bonding process. A lip portion is formed on one end of the rod receptor for interlocking engagement with the rod. The rod receptor is plated on the substrate and includes a generally circularly shaped body which forms a centrally disposed well for receiving the rod. A lip portion is formed on one end or mouth of the rod receptor for interlocking engagement with the rod. When the rod and corresponding receptor are aligned and brought together, the rod deforms and interlocks with its corresponding rod receptor. A thermo-compression bonding process is utilized to bond the rod to the rod receptor, thereby producing a strong interlocking bond.

6 Claims, 2 Drawing Sheets

APPARATUS AND METHOD FOR SNAP-ON THERMO-COMPRESSION BONDING

BACKGROUND OF THE INVENTION

The present invention relates generally to device packaging, and more particularly to the device interconnections for mounting semiconductor devices to substrates.

Rapid advances in technology have accelerated the need for device interconnections which can satisfy, among other requirements, a greater number of functions and increased speed without compromising yield or reliability. Conventional device interconnections include ball grid arrays, wire bonding, tape automated bonding, and controlled collapse chip connections, such as flip chip packages. Flip chip packages tend to be particularly popular because they have higher densities, thereby allowing more functions to be incorporated in a single package.

Conventional packaging techniques, including flip chip packages, however, fail to address the specific needs of high frequency semiconductor devices, particularly with respect to providing low loss, reproducible electrical interconnections at the substrate level for mounting semiconductors. Specifically, the attachment material in flip chip packages, typically solder, epoxy or gold, is applied directly to a semiconductor which is then aligned and attached to a substrate. Flip chip packaging techniques which utilize solder-type bump attachments are limited due to non-uniformity of solder bumps, poor wetting quality and reduced reliability caused by the use of fluxes. Additionally, because of the toxic nature of lead, elaborate manufacturing facilities are needed, resulting in high production costs and poor thermal conductivity particularly with respect to lead/tin based solder.

Flip chip packages which utilize epoxy-type bump attachments suffer from problems as well, including non-uniformity of epoxy bumps, a need for special application equipment, epoxy outgassing, bleed out contamination, poor thermal conductivity and restrictions in applying opto-electronic devices. Similarly, some of the problems associated with flip chip packages utilizing gold-type bumps include non-uniformity of gold bumps, poor thermal conductivity and size restrictions, with each ball typically having a minimum diameter of 125 microns.

What is needed therefore is a low loss, economical device interconnection for connecting semiconductors to substrates which would provide high bandwidth connections and provide improvements in yield and reliability.

SUMMARY OF THE INVENTION

The preceding and other shortcomings of the prior art are addressed and overcome by the present invention which provides, in a first aspect, a connected electrical apparatus, including a rod attached to a semiconductor device and having a body extending outwardly therefrom, with the rod having a base which extends radially outwardly therefrom, and a rod receptor attached to a substrate. The rod receptor is formed of a housing defining a well for receiving the rod, and includes a lip portion formed at one end of the rod receptor. The semiconductor device and substrate are interconnected by engagement of the rod to the rod receptor with the rod interlockingly engaging with the rod receptor lip portion.

In a further aspect of the invention, a method is provided which includes the steps of forming a rod with a base portion extending outwardly from an end thereof; and fixedly attaching the rod to a semiconductor device, with the rod base portion being disposed proximal to said semiconductor device. A rod receptor is formed of a housing defining a well and having a lip portion, where the receptor is then fixedly attached to a substrate with the housing lip portion being disposed distal from said substrate. The rod and rod receptor are aligned, and the rod is inserted into the rod receptor. The semiconductor device and the substrate are interconnected by engaging the rod with the receptor housing such that said rod spreads out and curls under the housing lip portion.

The foregoing and additional features and advantages of this invention will become apparent from the detailed description and accompanying drawing figures below. In the figures and the written description, numerals indicate the various features of the invention, like numerals referring to like features throughout both the drawing figures and the written description.

DETAILED DESCRIPTION OF THE PREFERRED EMBODIMENTS

Figure 1:
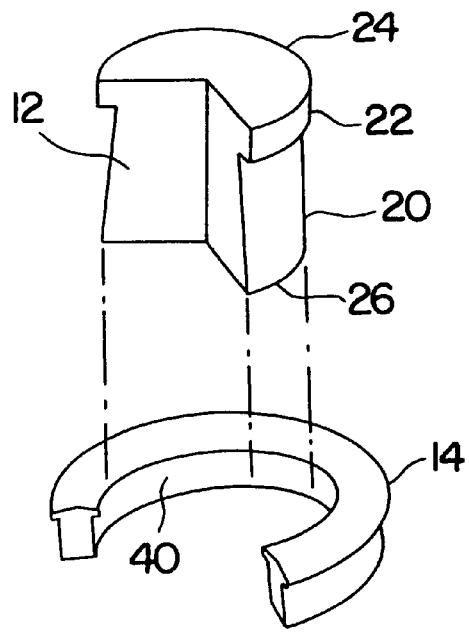
FIG. 1 is cross-sectional view of the rod and rod receptor in accordance with the preferred embodiment of the present invention.

Referring to FIG. 1, an interconnection device 10 for producing a low loss, reproducible electrical interconnection between a semiconductor device and a substrate is illustrated. In particular, the interconnection device 10 includes a rod 12 and rod receptor 14, for securely connecting a semiconductor device to a substrate. When the rod 12 and complementary receptor 14 are aligned and brought together, the rod 12 deforms and interlocks with its complementary receptor 14. The attachment process occurs while applying heat and force (thermal compression), thereby producing a strong interlocking bond. Sub-micron alignment tolerances can be obtained by utilizing photolithographic techniques in conjunction with plating techniques.

Figure 2:
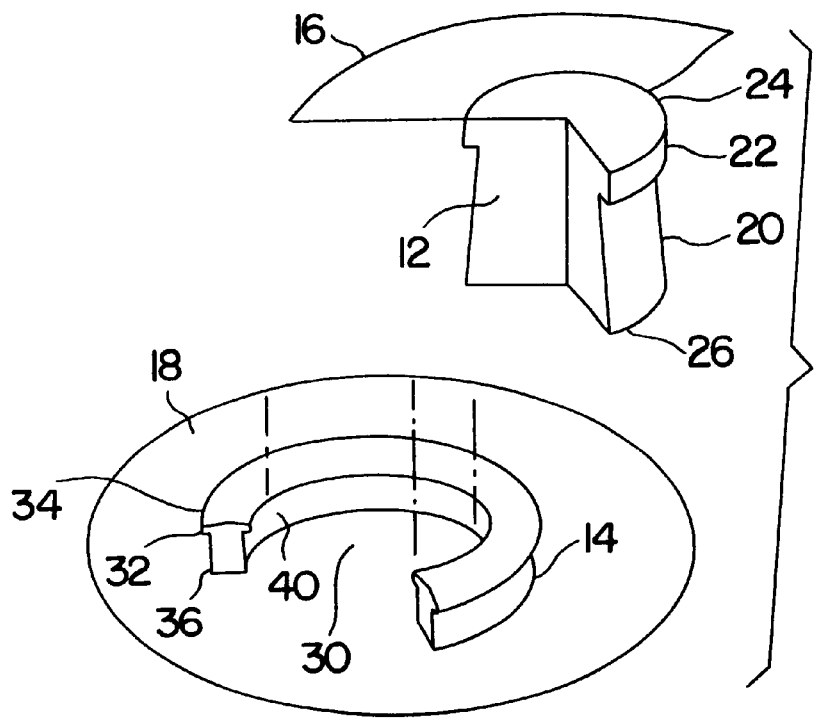
FIG. 2 is cross-sectional view of the rod and rod receptor plated on a semiconductor and substrate, respectively, prior to connection in accordance with the preferred embodiment of the present invention.

For illustrative purposes, and as shown in FIG. 2, the interlocking rod 12 and rod receptor 14 of the present invention are illustrated and described in conjunction with bonding a semiconductor 16 with a corresponding substrate 18. The present invention, however, is not limited to such an application, but rather may be utilized to interconnect electronic devices in general. For example, the interconnection device 10 of the present invention may be utilized to connect integrated circuit devices to any compatible device. In particular, the present invention may be utilized to replace standard flip chip techniques, increase the high frequency bandwidth of standard integrated and opto-electronics circuits and/or increase circuit density.

Additionally, the present invention is not limited to the use of a single interlocking rod 12 and receptor 14, but rather a plurality of interlocking rod 12 and receptors 14 can be utilized to fixedly secure a plurality of semiconductors 16 to a substrate 18. For example, a rod 12 may be plated on each of the semiconductors 16 to be bonded, while one or more corresponding rod receptors 14 are plated on the substrate 18, thereby providing for a greater number of functions to be incorporated, increasing speed and improving yield and reliability.

As is illustrated in FIG. 2, the rod 12 is generally cylindrically shaped with an outer circumferential wall 20 which comes into contact with the rod receptor 14 during the bonding process as explained in detail below. A base portion 22 is preferably formed on one end 24 of the rod 12 for supporting the rod 12 during the thermal compression bonding process. In particular, the rod 12 extends in a generally vertical direction and then in a generally outwardly horizontal direction before continuing in a generally vertical direction to form the base portion 22 for facilitating retention of the rod 12 with the rod receptor 14. The other end 26 of the rod 12 is generally flat and contacts the inner wall 40 of the rod receptor 14 and the gold (Au) metalized substrate 18 after the rod 12 and rod receptor 14 are bonded together. The rod 12 is preferably manufactured from a material which is conductive and compliant to thermally induced stresses, such as soft gold.

Referring to FIG. 2, the rod receptor 14 is generally cylindrically shaped with a hollow middle portion which when plated on the substrate 18 forms a centrally disposed well 30 for receiving the rod 12. A lip portion 34 is formed on an end or mouth 32 of the rod receptor 14 for interlocking engagement with the rod 12 as discussed in detail below. In particular, the rod receptor 14 extends in a generally vertical direction and then in a generally outwardly horizontal direction before continuing in a generally vertical direction to form a lip or flange portion 34 for facilitating retention of the rod 12 with the rod receptor 14. An end 36 of the rod receptor is plated on the substrate 18. The rod receptor 14 is preferably manufactured from a material which is conductive and compliant to thermally induced stresses, such as soft gold.

Figure 3:
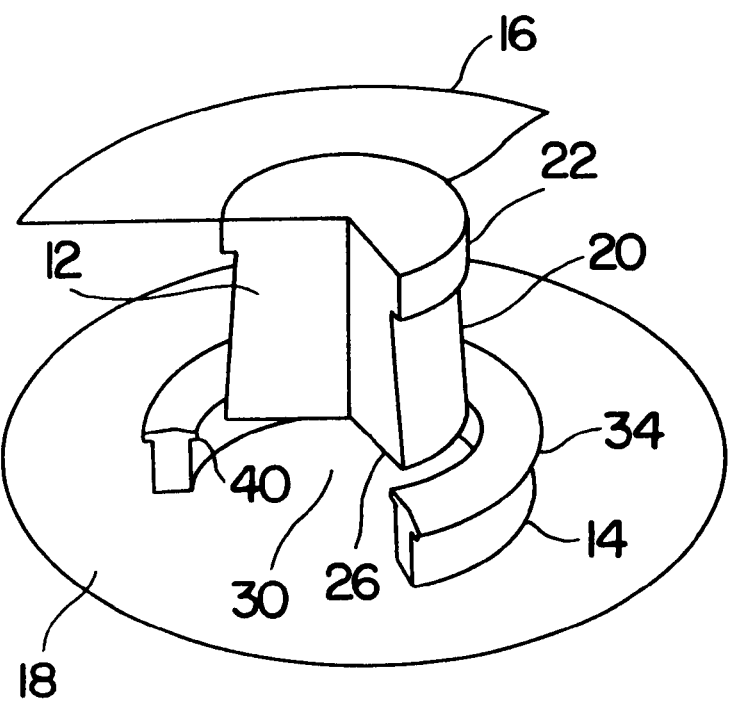
FIG. 3 is a cross-sectional view of the rod and rod receptor plated on a semiconductor and substrate, respectively, during connection in accordance with the preferred embodiment of the present invention.
Figure 4:
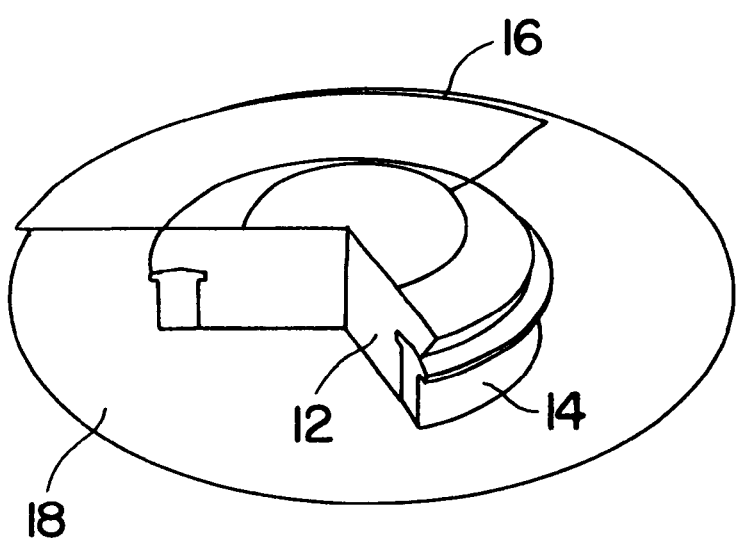
FIG. 4 is a cross-sectional view of the rod and rod receptor plated on a semiconductor and substrate, respectively, after connection in accordance with the preferred embodiment of the present invention.

Referring to FIG. 3, during bonding, the rod 12 is axially aligned with the rod receptor 14 and brought into contact with the rod receptor 14. The rod 12 and rod receptor 14 are then pushed or snapped together, causing the rod 12 to deform and interlock with the rod receptor 14 as illustrated in FIG. 4. In particular, referring to FIGS. 3 and 4, the outside wall 20 of the rod 12 initially contacts the inner wall 40 of the rod receptor 14. As the rod 12 is further positioned within the rod receptor 14, the end 26 of the rod 12 engages the well portion 30 of the rod receptor 14 housing, causing the outside wall 20 of the rod 12 to spread out and curl under the lip portion 34 of the rod receptor 14, thus securely interlocking the rod 12 to the rod receptor 14 and correspondingly the semiconductor 16 to the substrate 18, as illustrated in FIG. 4.

The connection process, preferably a thermo-compression bonding process, occurs while applying heat and force, thereby producing a strong interlocking bond. During thermo-compression bonding, a combination of pressure and temperature sufficient to create a strong mechanical adhesion between the two layers of gold is applied. The amount of heat required to thermally compress and bond the rod 12 and rod receptor 14 together is dependent upon the type of material utilized to construct the rod 12 and rod receptor 14. For example, the temperature and pressure required to thermally compress and bond a rod 12 and rod receptor 14 constructed from gold is approximately 300 degrees Celsius at 300 psi. The temperature varies in accordance with the amount of pressure applied to the rod 12 and rod receptor 14.

In accordance with an advantage of the present invention, the interconnection device 10 eliminates flux contamination and epoxy residues, increases thermal dissipation properties, increases electrical conductivity, increases shear strength by having plated components on both the semiconductor 16 and substrate 18, increases circuit density by reducing component size requirements, allows for additional surface for component integration, decreases alignment tolerances for opto-electronic devices, provides for uniform separation of semiconductor 16 and substrate 18 and increases reliability.

The present invention is not limited to the rod 12 and rod receptor 14 having a generally cylindrically shaped configuration but rather may be configured in any suitable geometric configuration. For example, the rod 12 and rod receptor 14 could be configured in a semi-cylindrical, semi-circular, oval, square or rectangular shape. Moreover, the present invention is not dependent on the rod 12 and rod receptor 14 being positioned on the semiconductor 16 and substrate 18, respectively, but rather each may be interchangeably positioned.

It will be appreciated by persons skilled in the art that the present invention is not limited to what has been shown and described hereinabove, nor the dimensions of sizes of the physical implementation described immediately above. The scope of invention is limited solely by the claims which follow.

What is claimed is:

1. A connected electrical apparatus comprising:
   a semiconductor device having a rod physically attached thereto and extending from said semiconductor device, said rod including a base portion extending outwardly from an end of the rod proximal to the semiconductor device; and
   a semiconductor substrate having a rod receptor attached thereto, said rod receptor comprising a housing defining a well for receiving said rod and including a lip portion at an end of said housing distal from said substrate,
   said well being shaped to fittingly engage said rod with said rod body interlockingly engaging said housing lip portion whereby said rod body spreads out and curls under said rod receptor lip portion and wherein said semiconductor device and said substrate are interconnected by engagement of said rod to said rod receptor.

2. The apparatus claimed in claim 1 wherein said rod is generally cylindrically shaped.

3. The device claimed in claim 2 wherein said well is generally cylindrically shaped such that said rod is fittingly engaged within said rod receptor.

4. A connected electrical apparatus comprising:
   a semiconductor device having a rod physically attached thereto and extending from said semiconductor device, said rod including a base portion extending outwardly from an end of the rod proximal to the semiconductor device; and
   a semiconductor substrate having a rod receptor attached thereto, said rod receptor comprising a housing defining a well for receiving said rod and including a lip portion at an end of said housing distal from said substrate,
   said rod and said rod receptor being formed of a material comprising gold,
   said well being shaped to fittingly engage said rod with said rod body interlockingly engaging said housing lip portion wherein said semiconductor device and said substrate are interconnected by engagement of said rod to said rod receptor.

5. The apparatus claimed in claim 4 wherein said rod is generally cylindrically shaped.

6. The device claimed in claim 5 wherein said well is generally cylindrically shaped such that said rod is fittingly engaged within said rod receptor.

* * * * *